(12) United States Patent
Arbesman et al.

(10) Patent No.: US 8,894,228 B2
(45) Date of Patent: Nov. 25, 2014

(54) SOLAR COLLECTOR

(76) Inventors: Ray Arbesman, Toronto (CA); Nghi Pham, Concord (CA); Albert Bachli, Toronto (CA)

( * ) Notice: Subject to any disclaimer, the term of this patent is extended or adjusted under 35 U.S.C. 154(b) by 52 days.

(21) Appl. No.: 13/340,432

(22) Filed: Dec. 29, 2011

(65) Prior Publication Data

US 2013/0170058 A1   Jul. 4, 2013

(51) Int. Cl.
*G02B 5/10* (2006.01)

(52) U.S. Cl.
USPC ............................................ 359/853; 126/684

(58) Field of Classification Search
USPC ................... 359/853; 126/685, 690, 692, 696
See application file for complete search history.

(56) References Cited

U.S. PATENT DOCUMENTS

| 2,097,291 | A | 10/1937 | Curtiss |
| 2,204,430 | A | 6/1940 | Montague |
| 2,751,816 | A | 6/1956 | Strong |
| 3,337,871 | A | 8/1967 | Greenberg et al. |
| 5,153,780 | A | 10/1992 | Jorgensen et al. |
| 7,324,067 | B2 | 1/2008 | Shen |
| 2001/0036024 | A1* | 11/2001 | Wood ............................ 359/853 |
| 2004/0004175 | A1* | 1/2004 | Nakamura ................. 250/203.4 |
| 2010/0006139 | A1* | 1/2010 | Zahuranec et al. ........... 136/246 |

* cited by examiner

*Primary Examiner* — William Choi
*Assistant Examiner* — Sharrief Broome
(74) *Attorney, Agent, or Firm* — Patterson & Sheridan, LLP

(57) ABSTRACT

A solar collector array is disclosed. The array has a plurality of thin walled dishes interconnected by unitary webbing. The dishes and the webbing are formed from a single metallic sheet. Each dish is pressed into a symmetric parabolic surface that concentrates incident light to a position in front of the dish.

6 Claims, 14 Drawing Sheets

SOLAR COLLECTOR

BACKGROUND OF THE INVENTION

1. Field of the Invention

The present invention relates to the collection of solar energy, and more particularly to a solar collector and an apparatus and method for making a solar collector that concentrates energy (predominantly in the form of incident light) from the sun.

2. Description of the Related Art

Solar collectors gather energy from the sun. The gathered energy may be used for various applications, including generating electricity, heating water and producing motion (in a sterling engine or equivalent heat engine).

A particular type of solar collector is a solar concentrator. Solar concentrators increase the energy intensity of sunlight by focusing light rays to a defined location (generally denoted as the focal location of the collector). The collection capacity of a solar concentrator is defined by the reflective surface area available to concentrate incident light (the collection surface area), although the specific configuration of the collection surface and other considerations influence the overall concentration efficiency (the amount of energy concentrated for a given collection surface area).

Solar concentrators focus sunlight that is incident on the collection surface to a surface of smaller area at the focal location. By concentrating light from a larger area (the collection surface) to a smaller area (the focal location), the solar concentrator increases the irradiance (a measure of the collected lights energy intensity, measured as the energy per unit area) of the light. The concentration factor of a solar concentrator is the ratio of the collection surface area to the focal location area. A larger concentration factor indicates greater light intensity at the focal location for a given collection surface area.

The energy concentrated at the focal location is capable of generating extremely high temperatures. This high energy intensity makes solar concentrators particularly suitable for heating applications. Solar concentrators can also reduce the capital cost of converting energy into electricity, as a smaller photovoltaic cell area is required to capture the light of the collection surface (although the cell may require greater temperature resistance).

Conventional solar concentrators may be anchored in a stationary position or mounted to a tracking mechanism that follows the movement of the sun across the sky. The mounting arrangement of the concentrator influences the collection surface design of the concentrator. Stationary concentrators focus incident light to the same focal location independent of the sun's position. However, the shape of the collection surface employed in stationary concentrators generally produces a lower concentration factor and reduced efficiency compared with tracking concentrators, a result of having to accommodate a greater range of incident light angles. Conversely, the shape of the collection surface employed in tracking concentrators can be optimized for a particular angle of light incidence at the expense of increased capital expenditure associated with the tracking mechanism.

Conventionally, tracking solar concentrators are fabricated with large collection surface areas. These dishes are capable of concentrating large quantities of solar energy into a small space at the focal location. It is not uncommon for parabolic solar concentrating dishes to have diameters in excess of 6 ft to enhance the sunlight gathering capabilities of the collection surface. Large solar concentrators have several advantages. Primarily, the number of transducers or other energy conversion mechanisms required to utilize the concentrated sunlight for a given surface is reduced. This is a common motivator for using solar concentrators, as the transducer contributes a significant cost to the overall solar collection system. The number of transducers required to utilize the collected energy for a given surface area is directly related to the number of solar concentrating dishes employed, as each dish concentrates energy to a unique focal location.

Another advantage is that a reduced number of tracking mechanisms are required to orientate the dish of a tracking concentrator with respect to the sun. Tracking mechanisms, like transducers, introduce substantial cost to the solar collection system.

However, there are also several disadvantages of large surface area solar concentrators. Primarily, the large collection surfaces are difficult to fabricate. The size of each dish prevents standardized machining and consequently most dishes are hand shaped by a specialist. The collection surface is commonly formed from several large panels that are individually shaped and subsequently joined together, a process that introduces inaccuracies that affect the reflection characteristics of the dish. The inaccuracies can usually be attributed to inevitable shaping variations, the accumulation of tolerances over the entire collection surface and irregularities at the joints between adjacent panels forming the surface.

The overall curvature variation for a collection surface comprising individually shaped panels is an accumulation of tolerances from the individual panels and the joints between adjacent panels. Commonly, each panel is shaped to a desired tolerance. A tolerance is also allocated for the joints between adjacent panels when the collection surface is formed. The overall tolerance for the collection surface is then a combination of the tolerances for the individual components, making accurate surface curvatures increasing difficult to obtain. Significant surface irregularities can occur in collection surfaces formed from panels even when the individual panels are within desired tolerance limits.

The largest curvature irregularities in panel collection surfaces typically occur at the joint between adjacent panels. Joint irregularities can create rapid transitions in surface curvature (sometimes characterized by surface discontinuities) that disrupt reflected light and reduce the efficiency of the concentrator.

The large size of panel surface concentrating dishes can also translate into significant weight. It is not uncommon for large concentrating dishes to weigh in excess of 500 lbs. The excessive weight of large panel dishes necessitates greater support facilitates, which can increase the initial cost of the concentrating system. Weight is particularly important when considering tracking solar dishes, as the tracking mechanism must incorporated larger actuators to offset the mass of the dish. Another complication is wind shear, which increases with surface area. To address wind shear, both the dish and the supporting structure need to be adequately reinforced.

SUMMARY OF THE INVENTION

It is desirable to produce a solar collector that is:
1. Accurately mass produced in a progressive stamping die instead being fabricated from the conventional manual process used today.
2. Significantly lighter than conventional solar collectors for the same concentration space (up to 2.5 times lighter).
3. Significantly cheaper to manufacture than conventional solar collectors (up to 2.5 cheaper).

4. More accurately shaped to a parabolic dish than conventional solar collectors.
5. Capable of accurately concentrating light to a desired intensity and position that are determined prior to fabrication.

In a first aspect, a solar collector array is provided comprising a plurality of thin walled dishes interconnected by a unitary webbing, the dishes and the webbing being formed from a single metallic sheet, each dish having a parabolic surface that concentrates incident light to a position in front of the dish.

In a second aspect, a solar collector die set is provided comprising:

a base block that mounts to a stamping press, the base block having a cutting die and a shaping die, the shaping die having a parabolic cavity that a metallic strip is pressed into, an upper block with complimentary cutting and shaping dies, the shaping die of the upper block having a parabolic dome punch that presses the metallic strip into the shaping cavity to form a parabolic dish solar collector, and a cutting block that mounts to the stamping press adjacent the base block, the cutting block having a fixed lower blade and a moving upper plate that cuts the parabolic dish solar collector into arrays of desired length.

In a third aspect, a method of fabricating a solar collector is provided comprising:
i. feeding a continuous metallic strip into a progressive die set, the progressive die set being mounted to a reciprocating stamping press,
ii. punching a solar collector blank from the metallic strip by actuating the stamping press,
iii. advancing the solar collector blank within the die set by feeding a new section of the metallic strip into the die set,
iv. simultaneously pressing the solar collector blank into a dish and punching a new solar collector blank from the new section of metallic strip by actuating the stamping press, the new solar collector blank and the dish being interconnected by a unitary webbing formed from the metallic strip,
v. repeating steps iii and iv to produce a continuous array of interconnected solar collectors, and
vi. cutting the metallic strip after a defined number of stamping press reciprocations to produce an array of solar collectors with a desired number of interconnected dishes.

Some of the solar collectors disclosed and claimed in this specification are defined by the 'form factor' of their collection surface. The 'form factor' of a solar dish represents the planar footprint the dish collection surface can be accommodated within. For instance, a 'form factor' of 3 ft by 3 ft will accommodate a paraboloid collection surface with a perimeter diameter of up to 3 ft. The collection surface 'form factor' does not change with dish concavity (unlike the area of the collection surface).

Similarly, some of the solar collectors disclosed and claimed in this specification are defined as 'parabolic dish' concentrators. A 'parabolic dish' concentrator is a type of solar collector with a collection surface that approximates a circular paraboloid (also known as a paraboloid of revolution). A circular paraboloid or paraboloid of revolution is a 3 dimensional surface that is obtained by revolving a 2 dimensional parabola around its axis of symmetry.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
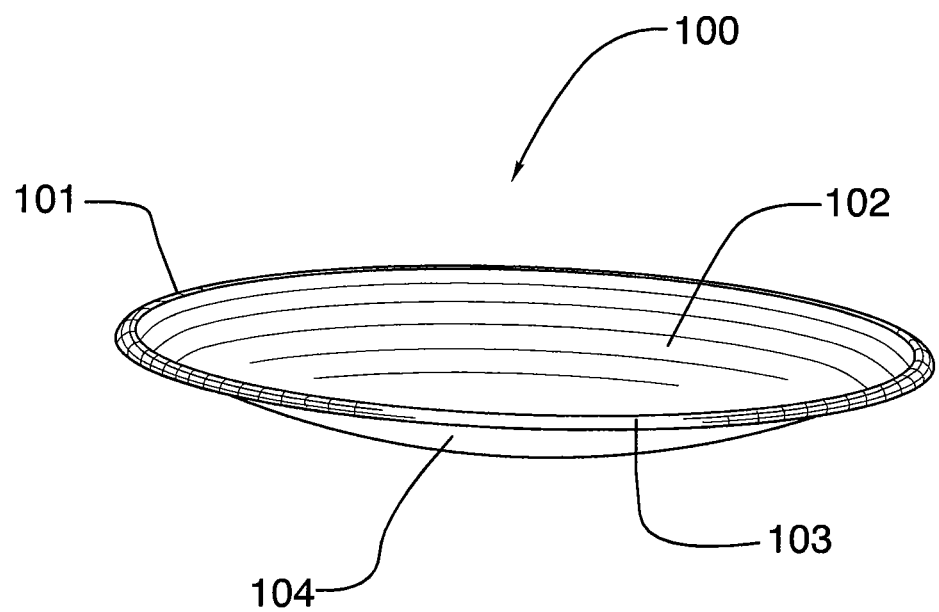
FIG. 1 is a perspective view of a solar collector comprising a concave metallic dish that concentrates incident light to a focal location defined by the curvature of the dish.

An individual solar collector is illustrated in FIG. 1. The solar collector 100 comprises a metallic dish 101 with a collection surface 102 that concentrates incident light to a focal location disposed in front of the dish. The position and size of the focal location is determined by characteristics of the collection surface 102 (such as the depth and curvature of the surface). The dish 101 is formed from a single metallic strip pressed into a symmetric concave shell. The shell is covered with a high reflectivity coating to improve collection efficiency. The collection surface 102 is delineated by a perimeter 103 with a form factor of less than 3 ft by 3 ft.

The 'form factor' of a solar dish represents the planar footprint the dish collection surface can be accommodated within. For instance, a 'form factor' of 3 ft by 3 ft will accommodate a paraboloid collection surface with a perimeter diameter of up to 3 ft. The collection surface 'form factor' does not change with dish concavity (unlike the area of the collection surface).

The solar collector 100 may incorporate an auxiliary supporting structure (not shown in FIG. 1) to stabilize the dish against disturbances (such as wind) and facilitate securement to a tracking mechanism or stationary frame.

Figure 2:
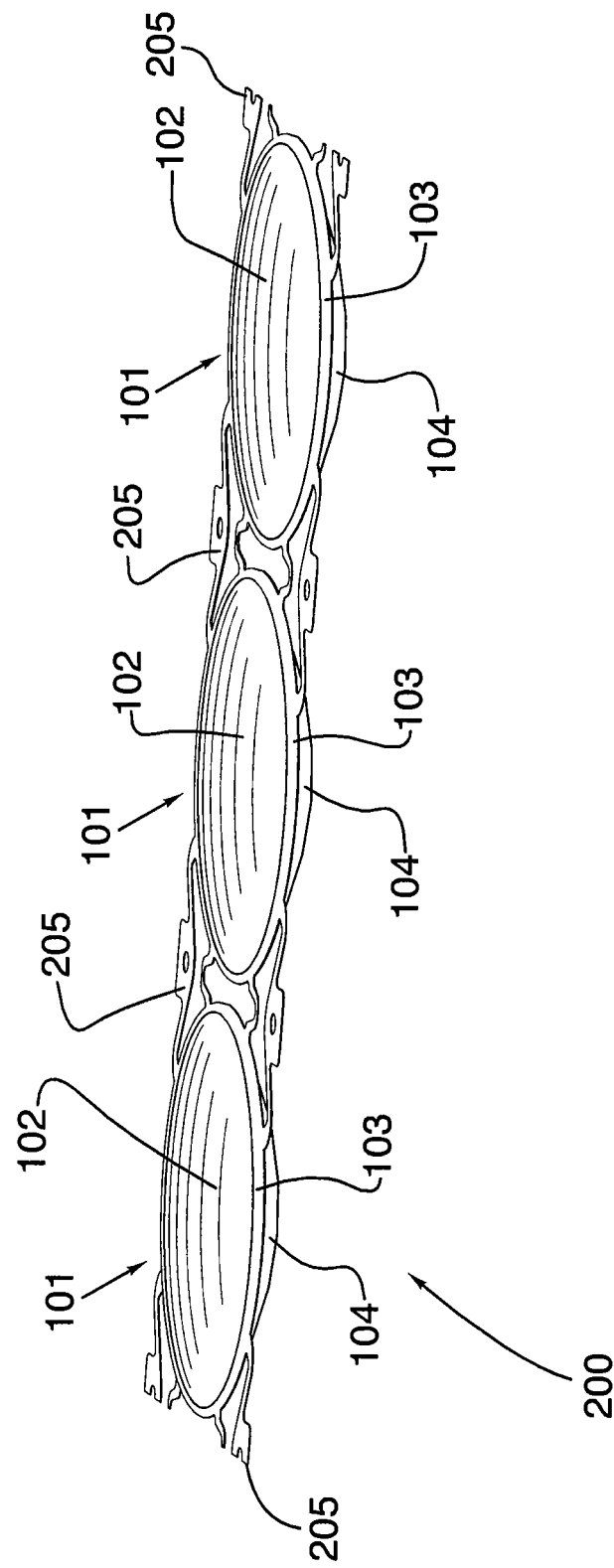
FIG. 2 is a perspective view of a solar collector array comprising three solar dishes interconnected by integral webbing.
Figure 3:
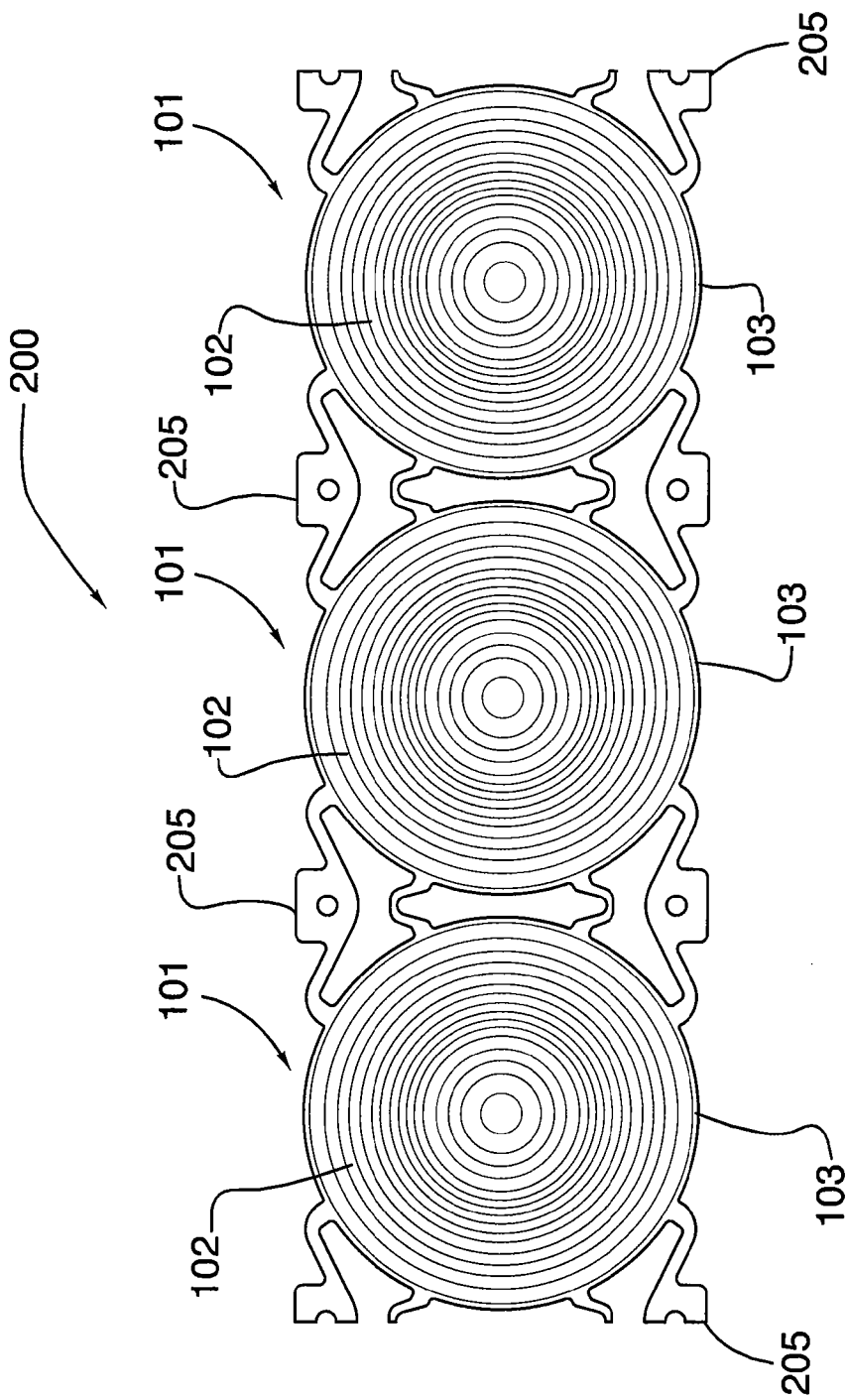
FIG. 3 is a top elevation of the solar collector array illustrated in FIG. 2.

An array of interconnected solar collectors is illustrated in FIGS. 2 and 3. The solar collector array 200 comprises a plurality of interconnected solar dishes 101 with similar characteristics to the solar collector dish 101 illustrated in FIG. 1. The dishes 101 of the solar collector array 200 are interconnected by a unitary webbing 205. The webbing 205 and the dishes 101 are formed from a single metallic strip. The individual dishes 101 of the solar collector array 200 each have a collection surface 102 that concentrates incident light to a position in front of the dish 101. The dishes 101 concentrate light to independent focal locations. The focal location of each dish is determined by the characteristics of the respective collection surface 102. The individual collection surfaces comprise a symmetric concave shell that is covered with a high reflectivity coating. Each collection surface is delineated by a perimeter with a form factor of less than 3 ft by 3 ft.

Figure 4:
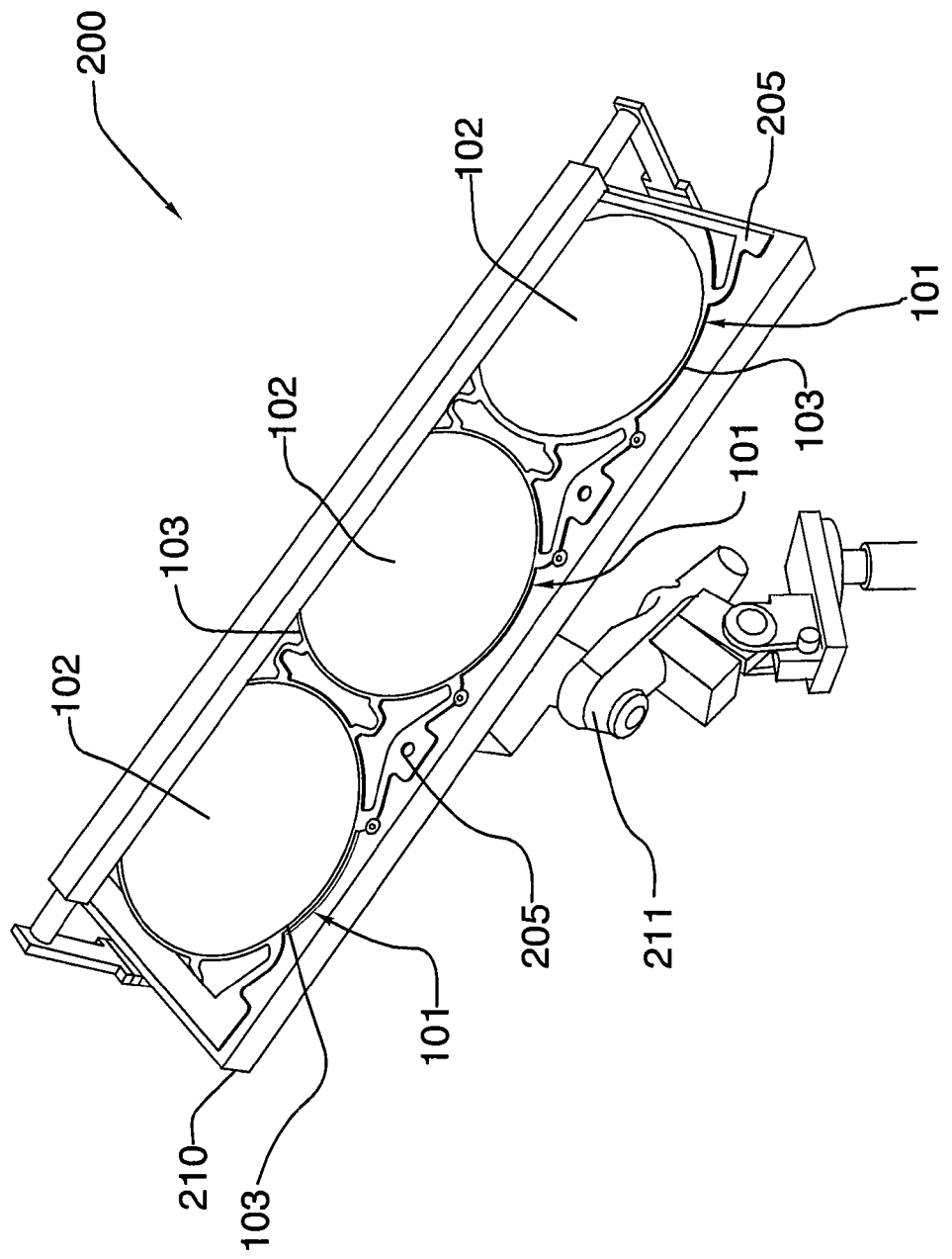
FIG. 4 a perspective view of the solar collector illustrated in FIGS. 2 and 3 affixed to a supporting structure and mounted on a tracking mechanism that follows the movement of the sun through the sky.

The solar collector array 200 is illustrated affixed to a supporting structure 210 in FIG. 4. The supporting structure 210 mounts the array 200 to a tracking mechanism 211. The tracking mechanism 211 follows the movement of the sun through the sky, positioning the solar collector array 200 so that incident sunlight is parallel with the axis of symmetry of each dish to optimize the collection efficiency of the array. The tracking mechanism illustrated in FIG. 4 is an articulated arm with two degrees of freedom (rotation about horizontal and vertical axes).

Figure 5:
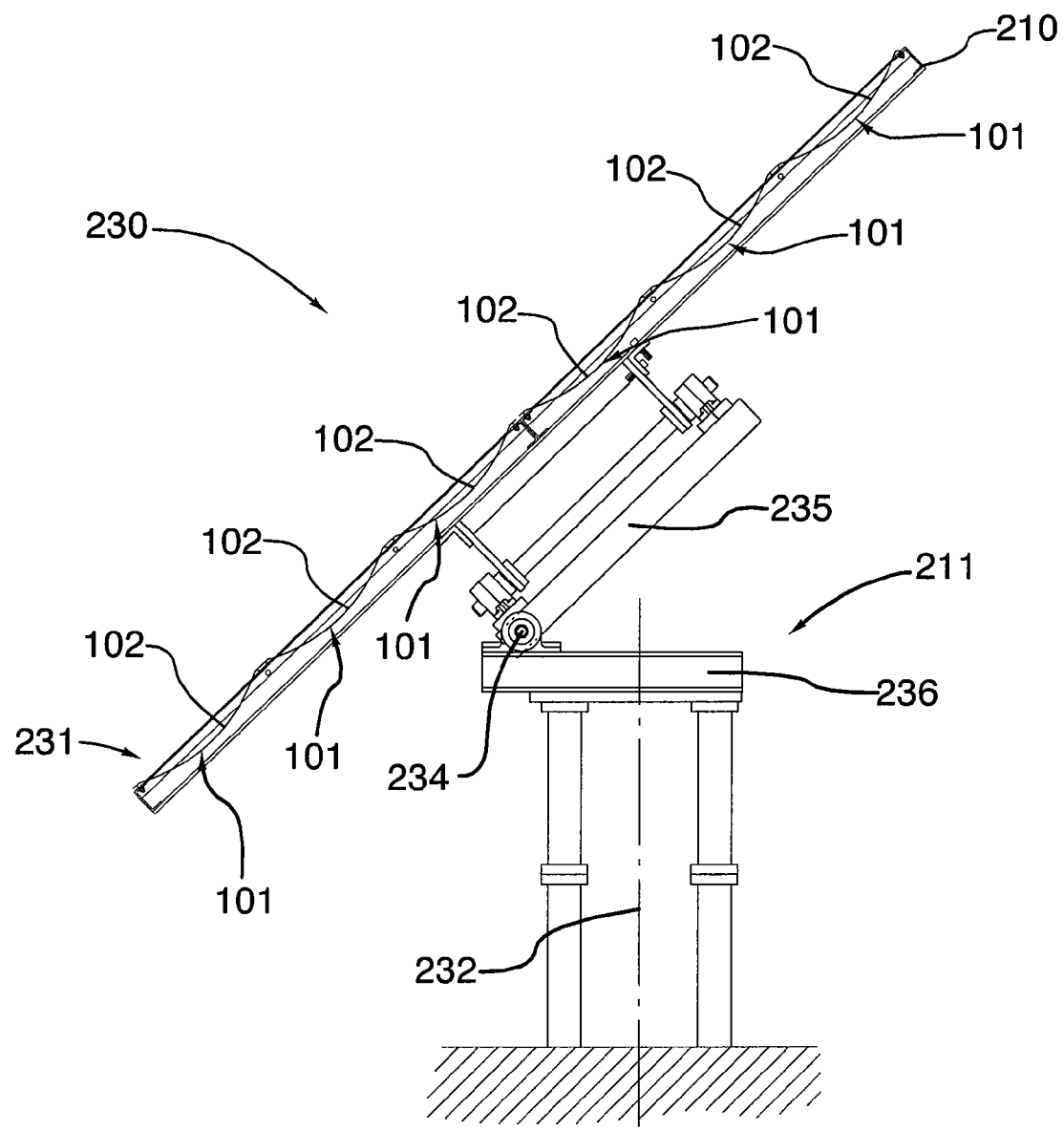
FIG. 5 is a schematic side elevation of a solar collector matrix affixed to a supporting structure and mounted on a tracking mechanism that follows the movement of the sun through the sky.

Another solar collector system 230 is illustrated schematically in FIG. 5. The system 230 has a simplified tracking mechanism 211 (with similar tracking characteristics to the articulated tracking arm illustrated in FIG. 4) for orienting the solar collector dishes 101. The tracking mechanism 211 illustrated in FIG. 5 has a tilting platform 235 that fastens to the solar collector supporting structure 210. The tilting platform 235 adjusts the angle the solar collector supporting structure 211 makes with the surface of the earth (ie. the angle the support structure 210 relative to the horizontal). The tilting platform 235 mounts to a swiveling platform 236. A pivot joint 234 couples the tilting platform 235 and the swiveling platform 236. The pivot joint 234 allows the tilting platform 235 to tilt relative to the swiveling platform 236. The swiveling platform 236 rotates the pivoted connection 234 with the tilting platform 235 about a vertical axis 232 extending thought the support structure 232.

Figure 6:
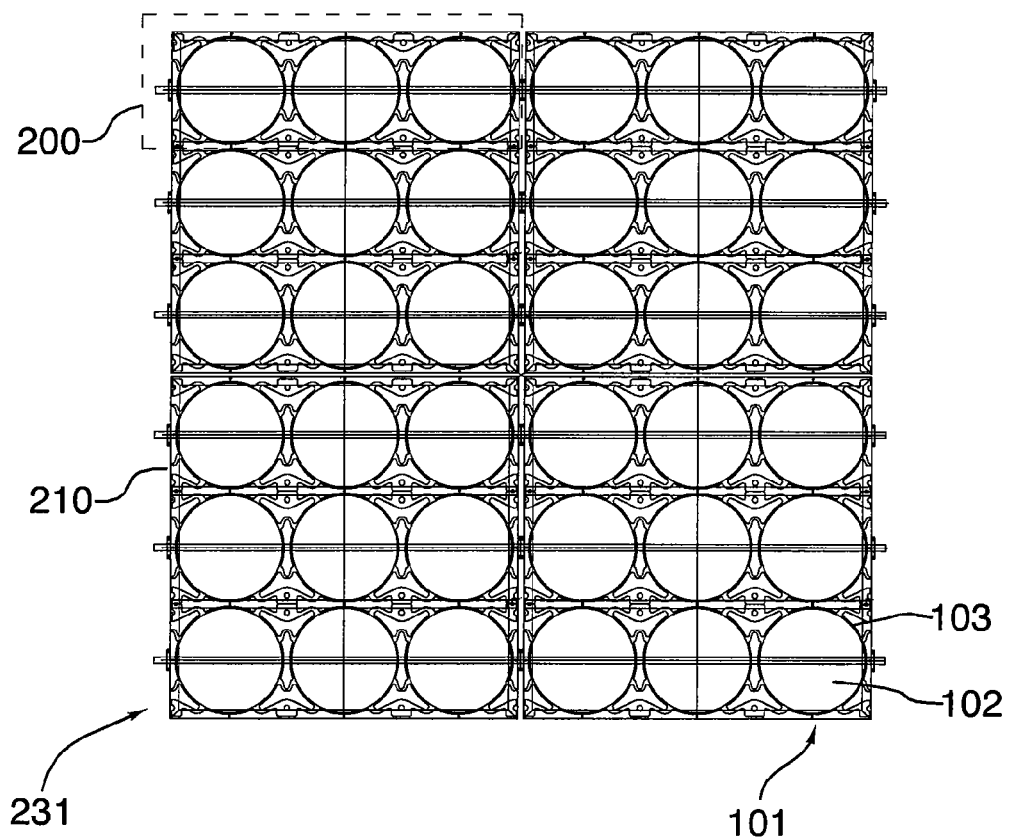
FIG. 6 is a schematic representation of a solar collector matrix affixed to a support structure, the illustrated matrix comprises 36 solar dishes arranged in a symmetric 6 dish by 6 dish matrix.

The illustrated system 230 has a symmetric thirty six dish matrix 231. The matrix 231 is illustrated in FIG. 6 affixed to a supporting structure 210. The individual dishes 101 of the matrix 231 are formed in arrays of three (similar to the arrays 200 illustrated in FIGS. 2 to 4). Twelve arrays 200 are secured to the supporting structure 210. The arrays 200 are arranged in two columns each having six rows, forming a 6 by 6 dish (6 by 2 array) matrix 231. The illustrated matrix 231 is significantly lighter than a conventional large surface dish collector with an equivalent surface area (about a fifth of the weight of traditional large surface collectors).

The integral webbing 205 that is formed with each solar collector array 200 (fabricated from the same metallic strip as each dish 101) is used to secure the arrays 200 to the supporting structure 210. The webbing 205 is disposed outside the perimeter 103 of the collection surface and interconnects each dish 101 with an adjacent dish. Each array 200 is mounted to the supporting structure 210 by appropriately securing the webbing 205. The webbing 205 may be spot welded, fastened, tolerance fitted, snap fastened or otherwise secured to a supporting structure 210. The webbing 205 is recessed behind each dishes 101 to avoid casting a shadow on the corresponding collection surface 102. A portion of the webbing 205 interconnecting the illustrated solar dishes 101 is retained generally flat so that it is easily fastened to a supporting structure. The solar collector 100 illustrated in FIG. 1 may also be formed with an integral webbing (not shown) to facilitate connection of the dish 101 to a supporting structure or interconnection with other dishes.

The illustrated solar dishes 101 are spaced at regular intervals along the solar collector array 200 without overlapping. The perimeter of adjacent dishes 101 is separated by a gap of at least 1 inch to allow wind to pass between the dishes, reducing the overall wind shear of the solar collector array 200 when compared to a single dish collector of equivalent surface area. The illustrated collector array 200 also has a gap of at least 1 inch separating the form factor of adjacent dishes.

The illustrated solar collectors 100, 200 have a rounded perimeter 103 that delineates the collection surface 102 from the rest of the dish. The rounded edge of the dish 101 is bent away from the collection surface 102 to create a lip around the backing 104 in the illustrated embodiment. A channel is formed between the rounded perimeter lip and the curved surface of the backing 104. The perimeter channel or the lip may be used to align the dish with a support structure.

The solar collector 100 illustrated in FIG. 1 and the individual dishes 201 of the solar collector array 200 illustrated in FIGS. 2 to 6 are embodiments of parabolic dish solar concentrators. Parabolic dish concentrators are defined by a collection surface that approximates a circular paraboloid (also known as a paraboloid of revolution). The illustrated collectors have a paraboloid surface with an outer perimeter diameter of less than 3 ft. To simplify fabrication, the outer perimeter diameter is preferably between 1 ft and 2 ft. Solar concentrators of this dimension are still capable of producing a light concentration of 4,000 suns at the focal location. A schematic illustration of theoretical parabolic dish 500 concentration characteristics is presented in FIG. 7. Parabolic dish concentrators have the greatest theoretical concentration factor (the ratio of collection surface area to focal location area) for a given collection surface area.

Figure 7:
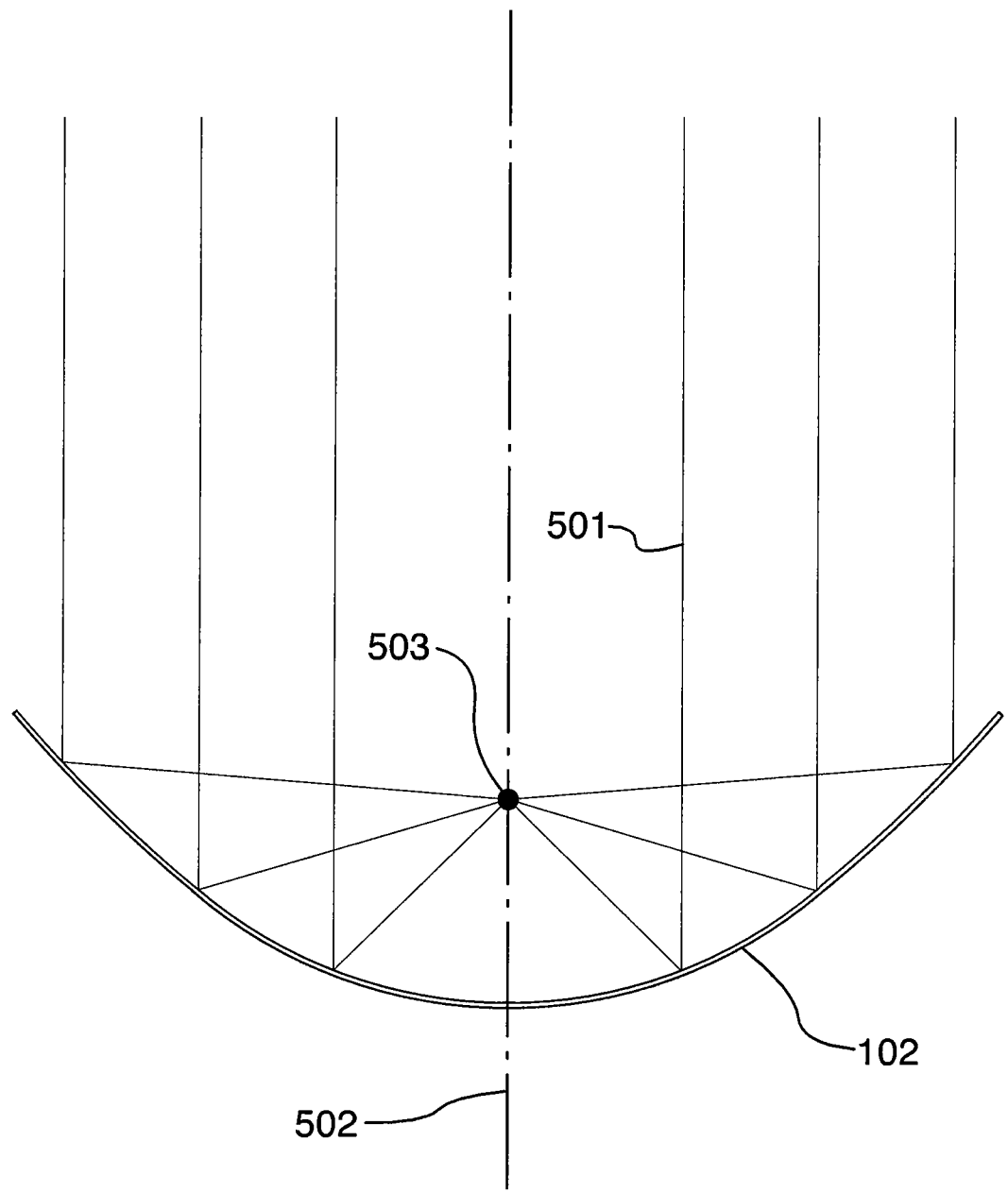
FIG. 7 is a schematic representation of incident sunlight being concentrated at the focal location of a parabolic dish collector.

In theory, parabolic dish collectors are capable of concentrating incident sunlight 501 travelling parallel to the collection surface axis of symmetry 502 to a focal location 503 that approaches a single point in space (as illustrated in FIG. 7). The theory assumes that light from the sun is travelling parallel (a slight approximation) and that the parabolic dish is correctly orientated with respect to the position of the sun in the sky (ie. the dish tracks the suns movement).

Conventional parabolic dish solar concentrators are commonly formed from several large panels that are individually shaped and subsequently joined together to form the collection surface. This process allows construction of solar concentrators with large surface areas, but can also introduce inaccuracies that affect the reflection characteristics of the dish. Panel dishes can be over 6 ft in diameter and weigh over 500 lbs.

Each of the solar dishes 101 illustrated in FIGS. 1 to 6 has a collection surface 102 that is formed from a single metallic strip, avoiding surface imperfections that can be introduced by combining multiple panels. Some advantages of single strip surfaces include greater curvature accuracy (as the entire collection surface can be shaped at the same time), removal of joint discontinuities (surface defects that can occur at the joint between adjacent panels), up to five time lighter weight for the same collection surface area (making supporting structures and tracking mechanisms significantly cheaper), accurate control of the temperatures generated at the focal location and reduced wind shear (as wind can pass through gaps between adjacent dishes).

Improvements in surface curvature accuracy achieved by single strip fabrication can generally be attributed to the reduction in overall tolerance and shaping simplification. The illustrated dishes 101 also have an uninterrupted collection surface 102 within the respective delineated perimeters 103. This reduces light scattering (deflection of incident light away from the focal location) and improves the gathering efficiency by providing an unabated reflection surface. Common collection surface interruptions include fastener holes, mounting brackets for a transducer disposed at the focal location and joint imperfections between adjacent panels. The illustrated dishes 101 also have a collection surface 102 that is uniformly coated with chrome to improve reflection characteristics.

The backing 104 of the solar collector dish 101 illustrated in FIG. 1 is visible on the underside of the collection surface 102. The backing 104 has a dull appearance when compared to the collection surface 102, despite being formed from the same metallic strip. The dull appearance of the backing 104 is predominantly attributable to the absence of the high reflectivity coating, but may be exaggerated by excessive cold working to form the concave structure (which can dull the surface). The dish backing 104 may incorporate fins (not shown) to improve the passive cooling characteristics of the solar collector 100 or a supporting structure (such as webbing) to facilitate securement of the collector to a stationary frame or tracking mechanism.

This fabrication approach provides several advantages over conventional solar concentrator manufacturing techniques that involve constructing the dish collection surface from several separate panels.

Fabricating a parabolic dish concentrator from multiple panels is a complicated process. The individual panels are shaped separately, each being conformed to an intricate surface curvature that replicates a particular part of the desired paraboloid surface (often by hand). The panels may incorporate specific edge features to reduce curvature variations when they are joined together and the paraboloid collection surface often requires some reshaping to correct curvature aberrations.

The overall curvature variation for a collection surface comprising individual panels is an accumulation of tolerances from the individual panels and the joints between adjacent panels, making accurate surface fabrication difficult. Curvature irregularities in panel collection surfaces typically occur near the joint between adjacent panels and can often be attributed to rapid transitions in surface curvature (sometimes characterized by surface discontinuities) between adjacent panels. These irregularities disrupt the reflected light and reduce the efficiency of the concentrator. Significant surface irregularities can occur in panel surfaces even when the individual panels are within desired tolerance limits.

Greater shaping accuracy can be achieved in single strip collection surfaces. The improved accuracy is generally attributable to a reduction in overall tolerance variation and simplification of the fabricating process. As the entire paraboloid surface is formed simultaneously, the curvature of the overall dish can be closely monitored and controlled to a single tolerance (removing tolerance accumulation). Curvature variations of unitary collection surfaces are generally less disruptive than similar irregularities on panel surfaces as the surface discrepancies are more likely to cause gradual curvature transactions and produce less extreme deviations from a desired curvature. However, single strip surfaces are limited in size and shape to accommodate available manufacturing machinery and material capabilities.

Figure 8:
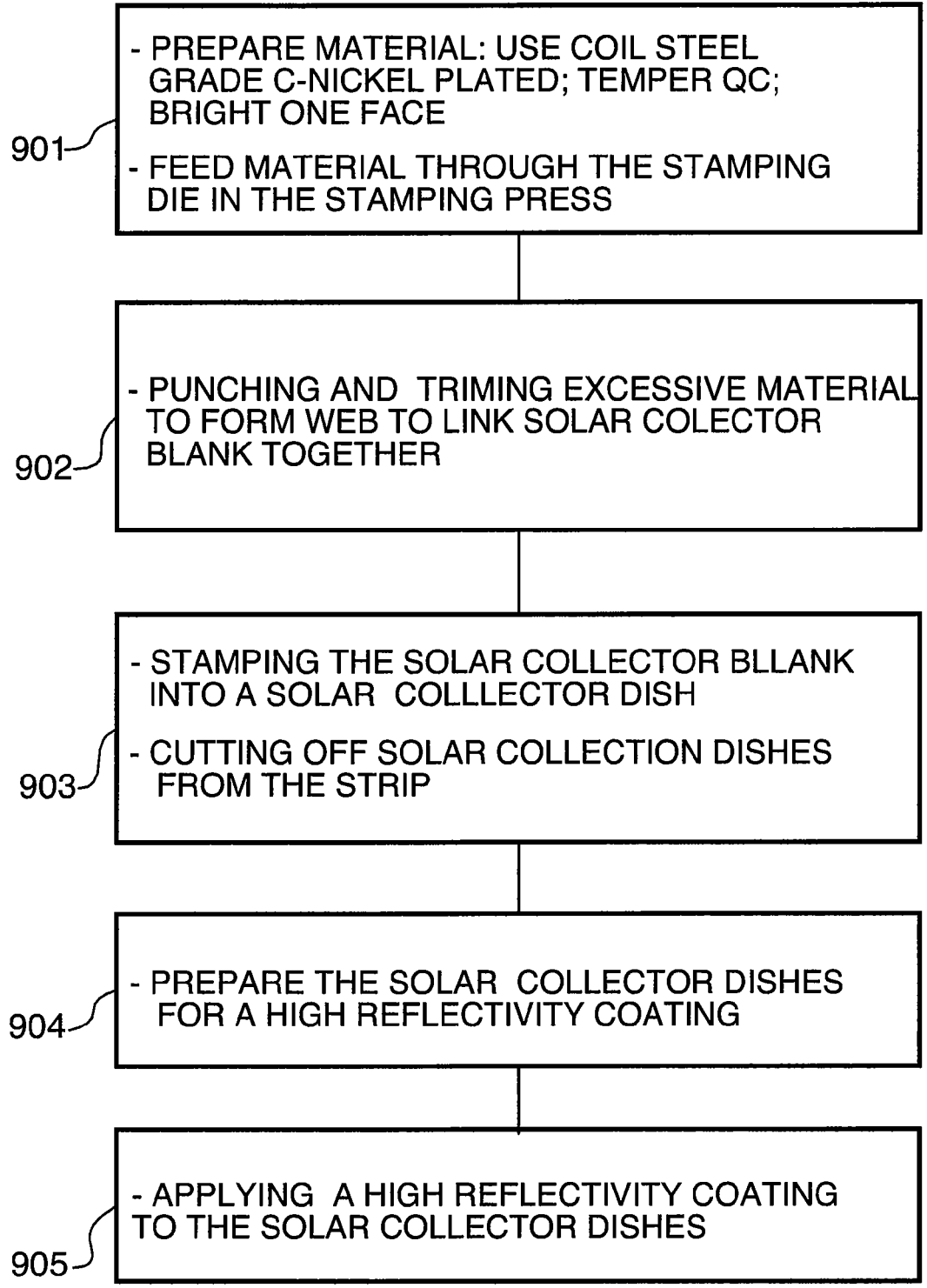
FIG. 8 is a flow chart representation of a manufacturing process for fabricating a solar collector array.

A method of fabricating a solar collector is presented in a flow chart in FIG. 8. The illustrated method comprises forming a solar collector array comprising a plurality of solar dishes from a single metallic strip. The progression of a metallic strip 800 to a solar collector dish is illustrated from right to left in FIGS. 13 and 14. A similar process can be followed to form a single solar collector dish.

A suitable metallic strip is initially prepared for fabrication, represented by step 901 of the flow chart 900. It is generally desirable that the metallic strip is corrosion resistant or is suitably coated to resist weathering that can adversely affect the structure or collection characteristics of the dish. Grade C-Nickel plated coil steel is one particular type of material that may be used and is presented in the flow chart as an example. Other types of metallic strip are suitable.

The metallic strip may require preparation before it can be formed. The strip may be stored in a coil or otherwise compressed to reduce storage space, potentially necessitating corrective flattening (such as straightening) before it may be processed. Once prepared for fabrication the strip is feed into a stamping die.

Figure 13:
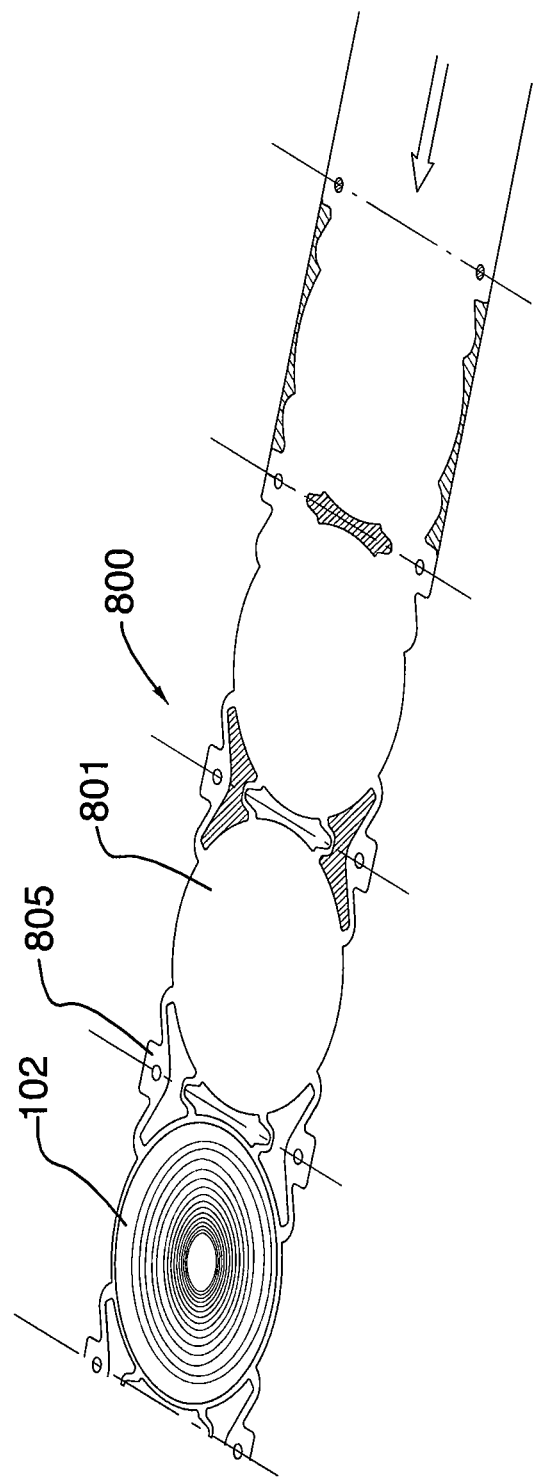
FIG. 13 is a schematic perspective view of a metallic strip illustrating some of the fabrication steps presented in the flow chart of FIG. 8.
Figure 14:
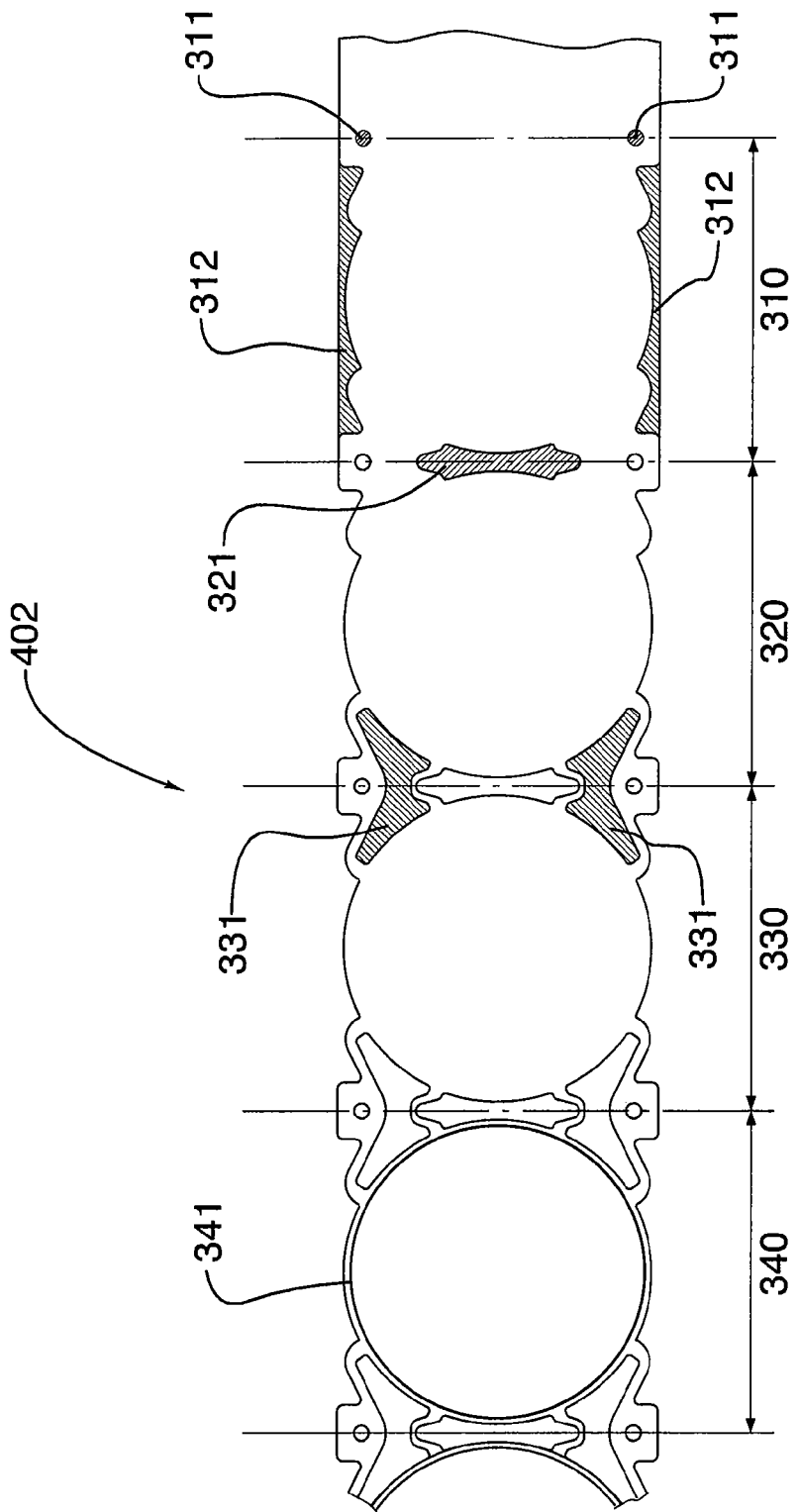
FIG. 14 is a schematic top elevation of the metallic strip illustrating the some of the fabrication steps presented in the flow chart of FIG. 8.

The metallic strip is then punched into a solar collector blank in a suitable die set, as represented by step 902 in FIG. 8 and illustrated in FIGS. 13 and 14. The punching process trims unwanted material 312, 321, 331 from the metallic strip, forming a plurality of flat solar collector blanks 801 that are interconnected by a unitary webbing 805. The illustrated blank 800 is suitable for forming a solar collector array 200 with similar attributes to the array 200 illustrated in FIGS. 2 to 6.

The strip 800 is then moved within a progressive die set to the next station for shaping (step 903). A perimeter edge of each dish is rounded during the shaping process to delineate the collection surface of each solar dish within the solar collector. The webbing 805 is also bent back during stamping so that the front of the solar collector is unobstructed. A continuous strip of interconnected solar collector dishes 101 is produced from the metallic strip 800. The strip may be cut into solar collector arrays with a desired number of dishes following shaping.

The solar collection dishes are prepared for coating (step 904). The preparation may include minor machining to remove surface imperfections and cleaning. The concave surface of each collection dish is then coated with a high reflectivity coating to improve the light concentration characteristics of the dish, represented by step 905. The coating may be applied before (especially if the dish blank is not significantly deformed during stamping) or after the blank is stamped. It is preferable that the dish is coated after stamping as there is a reduced risk of the coating being damaged (scratched during handling or cracked from deformation during stamping). A release liner (such as a thin plastic film) may be applied after the dish is coated to avoid incidental damage to the coated surface.

Figure 12:
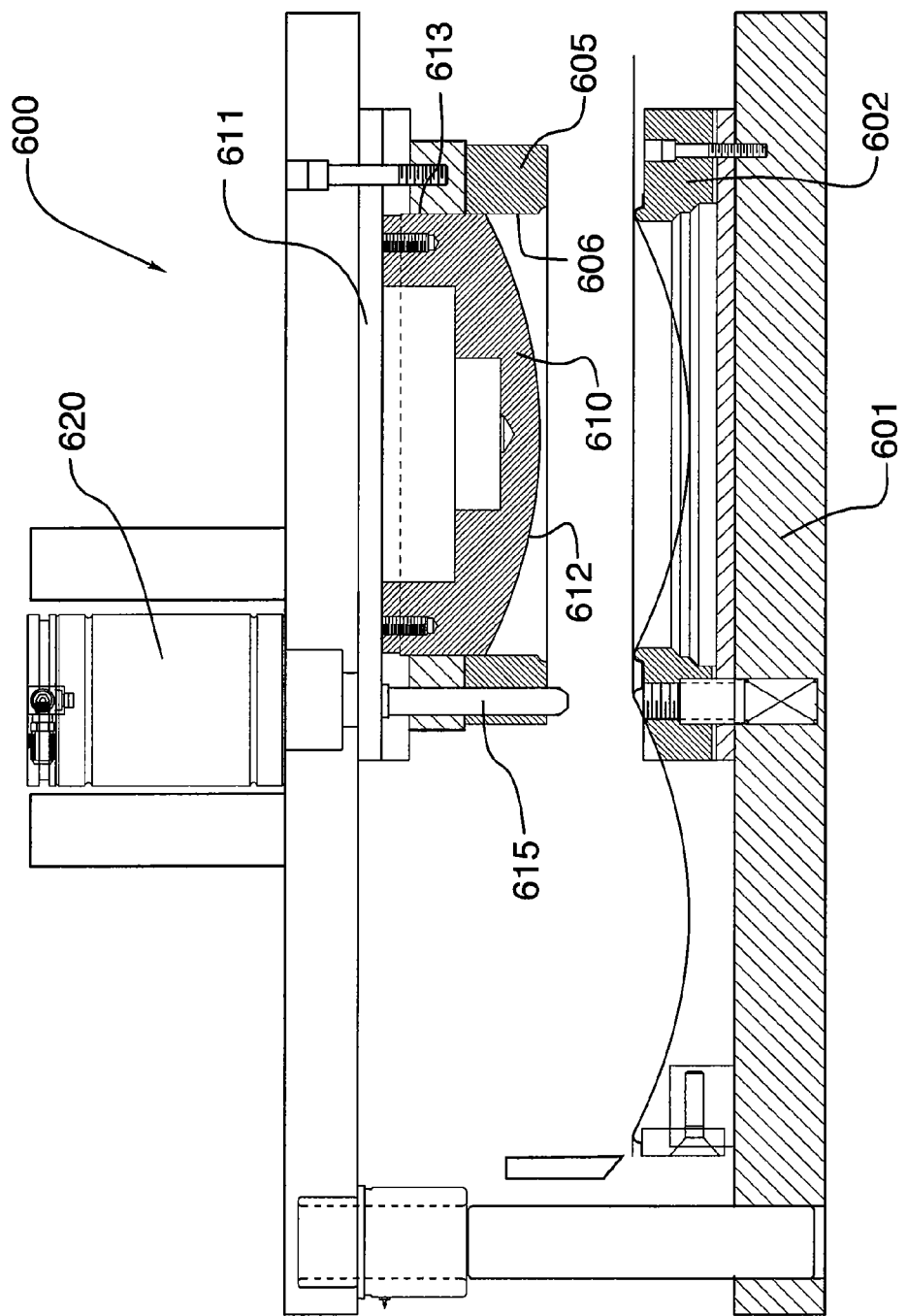
FIG. 12 is a close up side elevation of a die set for pressing a solar collector blank into a concave solar collector dish.

A die set for shaping a solar collector is illustrated in FIG. 12. The die set 600 comprises a base block 601 that mounts to the bolster plate of a stamping press. The base block 601 defines a concave shaping surface or cavity 602 that a workpiece (such as a solar collector blank) is positioned over during production. The concave shaping surface is disposed in the upper face of the base block 601. The base die block 601 secures the die set 600 to the stamping press. The block 601 is the only component of the die set 600 that is secured to the press and may be fastened directly to the bolster plate or otherwise secured.

An upper die 605 is positioned over the base block 601. The upper die 605 has a press surface 611 that the ram of a stamping press abuts with during production. A dome punch 610 projects downwardly from the upper die 605 below the press surface 611. The dome punch 610 has a convex punching surface 612 that is disposed directly over the lower block concave shaping surface 602. The concave shaping surface 602 of the lower block 601 and the convex punching surface 612 of the dome punch 610 are generally commensurate, forming reciprocal shaping surfaces. The convex punching surface 612 of the dome punch 610 is pressed into the block cavity 602 during production by the extension of the stamping press ram, causing the reciprocal shaping surfaces to mate and deform an appropriately positioned blank 800. The shape imparted to the blank 800 is defined by the reciprocal shaping surfaces of the die set 600. The blank 800 is securely restrained between the facing surfaces of the respective dies 601, 605 during shaping to reduce misshaping. The illustrated punching surface 612 and reciprocal pressing surface 602 approximate a parabolic dish shape. The dome punch 610 preferably has a circular perimeter 613 with a diameter of less than 3 ft. Ideally, the diameter of the dome punch 610 is between 1 ft and 2 ft.

The dome punch 610 has a pressure plate 605 that is pressurized by a gas spring 620. The pressure plate 605 grips the blank material when the dome punch 610 is pressed into engagement with the base block 601, forming a perimeter ring 103 around the collection surface of the solar collector dish 101. A plurality of gas springs 620 align the blank 800 with the base block 601 and upper die 605. The die set 600 may also engage a set of pilot holes 311 in the webbing 805 of a solar collector blank 800 during production to secure and positioned the blank during reciprocation of the stamping press ram.

A plurality of posts 615 extend between the base die 601 and the upper die 605. The posts 615 position the components of the die set 600. The posts 615 may slide within one of the dies 601, 605 during extension of the stamping press ram to facilitate mating of the upper 605 die with the base block 601.

The disclosed fabrication method and die set allow solar collectors to be accurately manufactured with standardized machinery and minimal specialist training. The energy concentration and temperature produced at the focal location of the resulting solar collectors can be accurately controlled by manipulating the dish depth and surface curvature. Additionally, the performance characteristics of individual solar concentrators can be accurately reproduced by standardizing the fabricating process as disclosed. Conversely, conventional large solar concentrators are commonly hand fabricated by specialists. As a result, there is often significant performance variation between conventional solar concentrators with similar attributes.

Figure 9:
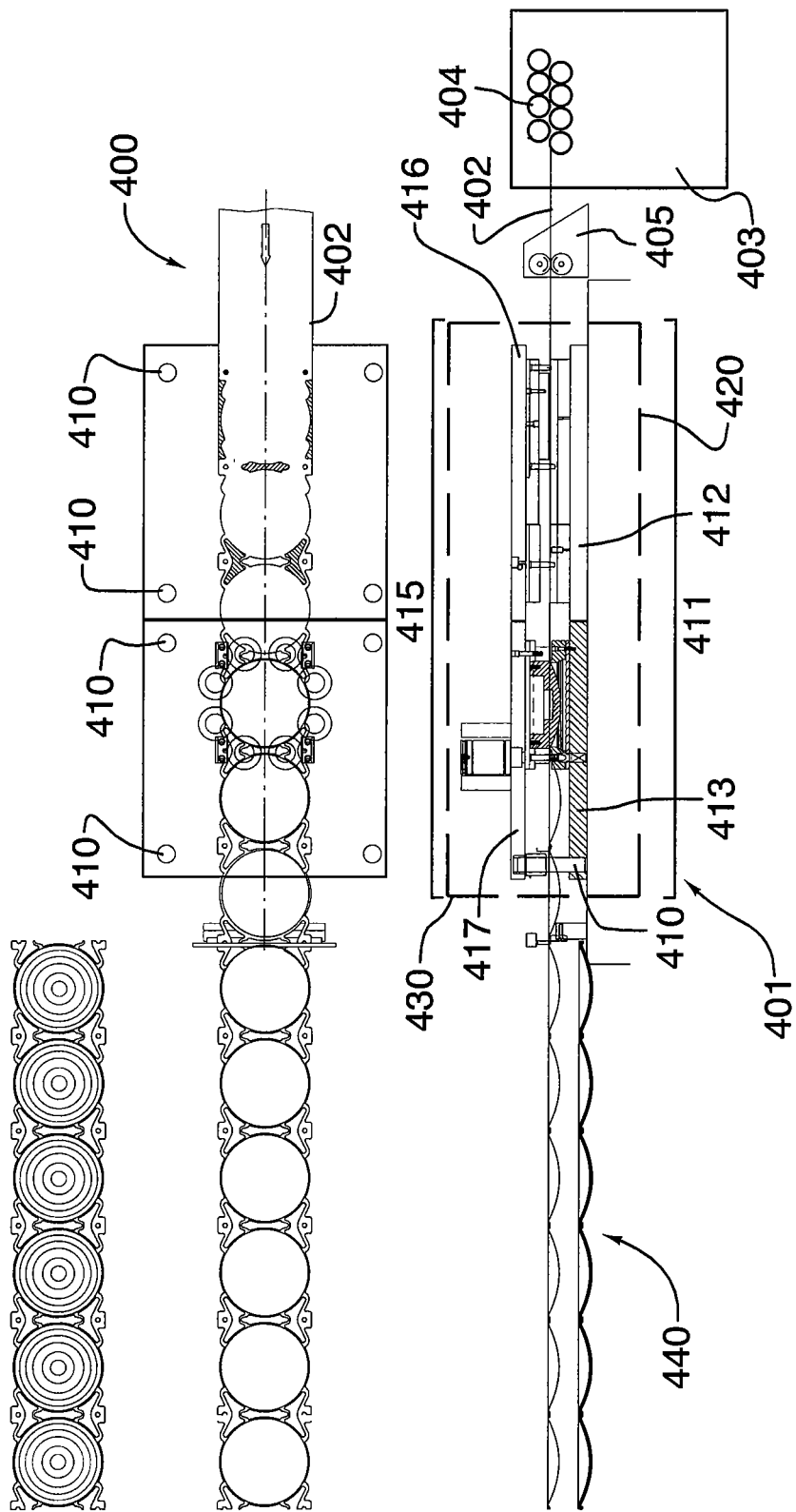
FIG. 9 is a side elevation of a manufacturing production line capable of producing an array of solar dishes, the production line incorporates a progressive die set that creates solar blanks and subsequently stamps solar collector dishes from the blanks, a continuous strip of interconnected solar collectors is illustrated at the outlet of the progressive die set.

A manufacturing production line capable of producing a continuous strip of solar collectors is illustrated in FIG. 9. A strip of six solar collectors 440 is illustrated at the outlet of the production line 400. The production line 400 is supplied with a continuous metallic strip 402. The metallic strip 402 is drawn into the production line 400 by a straightener 403. The straightener 403 is disposed at the intake of the production line 401.

The illustrated straightener 403 comprises a plurality of rollers 404 that flatten the metallic strip 402 in addition to drawing the strip into the production line. The metallic strip 402 may be stored in a condensed form prior to fabrication to reduce the burden on storage space. The straighteners 403 can correct residual bending in the strip 403 inherited from the stored form. Preferably the metallic strip 402 is stored in a coil so that it is readily accessible and requires minimal preparation before entering the production line 401. The illustrated straighteners 403 are capable of unraveling the metallic strip 402 directly from a coil.

A feeder 405 is disposed after the straightener 404 in the illustrated production line 401. The metallic strip 402 passes from the straightener 404 to the feeder 405. The feeder 405 regulates progression of the strip 402 through the production line 400. In the illustrated production line 400, the feeder 405 progresses the metallic strip 402 through a progressive die set 401. The feeder 405 advances the metallic strip 402 through the progressive die set 401 in discrete increments 310, 320, 330, 340 (illustrated in FIG. 14 in relation to the evolving workpiece formed from the metallic strip 302). The progression increment of the feeder 405 correlates to the form factor of the solar dish being fabricated, so that each operation of the progressive die set 401 is applied to each workpiece consecutively in discrete steps. The evolution of the metallic strip 402 as it advances through the progressive die set 401, compounding various different operations, is illustrated in FIGS. 13 and 14 from right to left.

Figure 10:
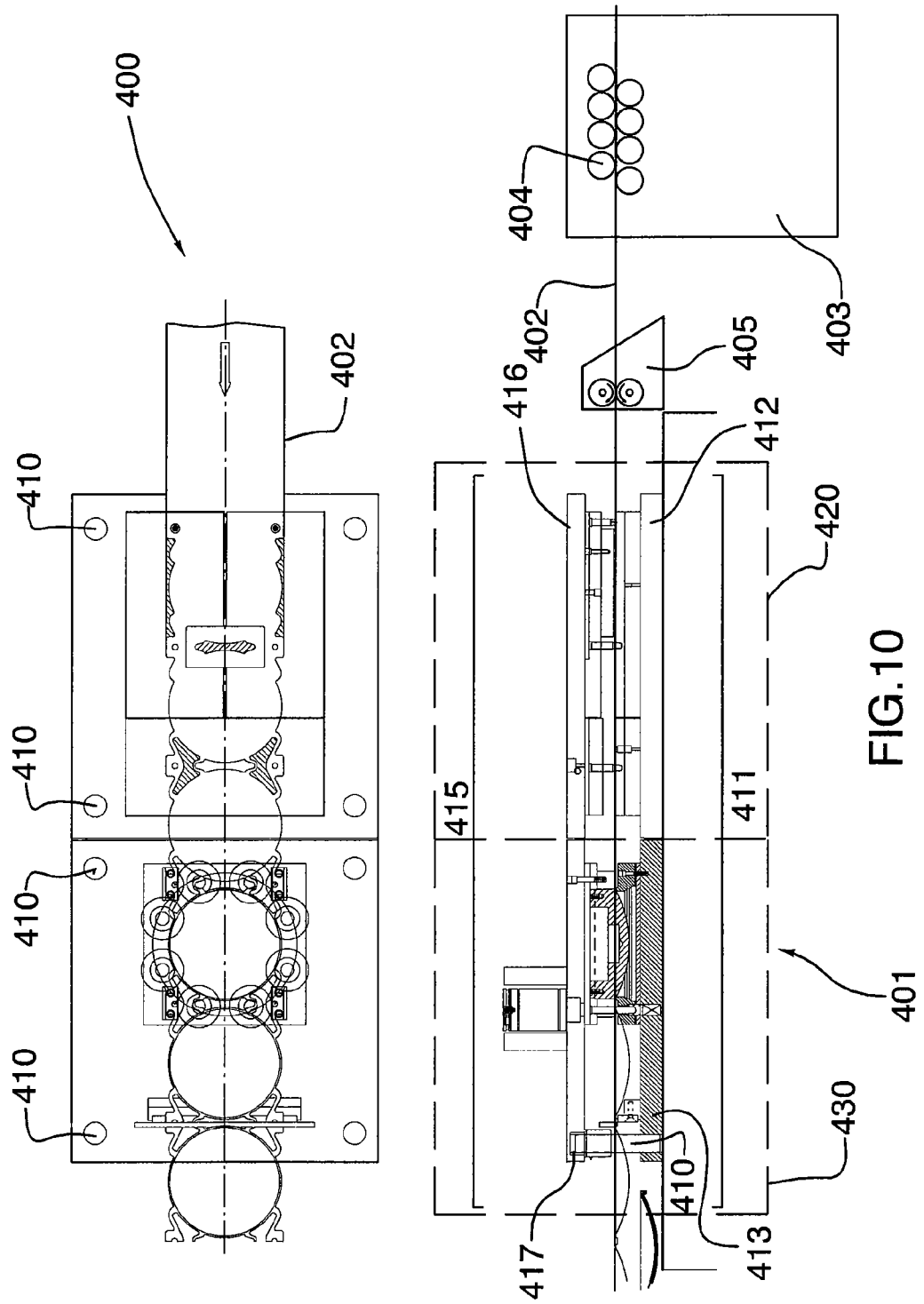
FIG. 10 is close up side elevation of the progressive die set and strip feeding apparatus illustrated in FIG. 9.
Figure 11:
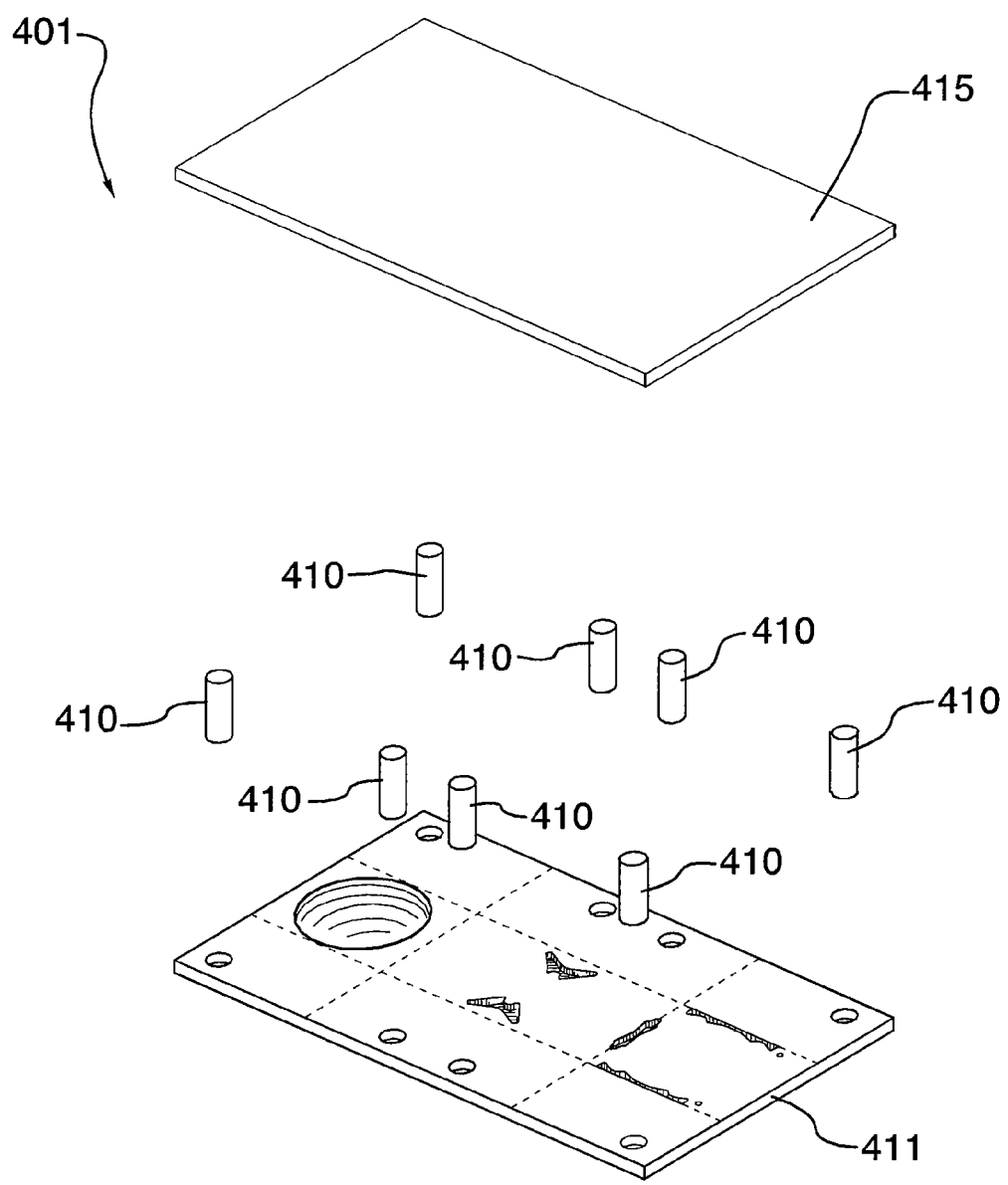
FIG. 11 is an exploded view of the progressive die set illustrated in FIGS. 9 and 10.

The progressive die set 401 is illustrated in side and top elevation in FIG. 10 and in exploded view in FIG. 11. The die set 401 performs various operations on the metallic strip 402 to implement steps 901 to 903 of the method illustrated in FIG. 8, creating an array of uncoated solar collectors at the output of the production line 400. The operations of the die set 401 are performed at various stations along the length of complimentary upper 415 and lower 411 blocks. Each station is arranged in either a blanking section 420 or a shaping section 430 in the illustrated die set 401.

The arrangement of stations depends on the type of operation the station performs on the metallic strip 402. The blanking section 420 cuts discrete segments of the metallic strip 402 (workpieces) into a suitable blank for forming into a solar collection dish. The shaping section 430 forms the workpiece blank into a suitable shape. The illustrated blocks 411, 415 are separated between the respective sections 420, 430, although this is not essential. The die set 401 is formed in separate sections 420, 430 to facilitate independent maintenance and replacement of the sections. However, the die set 401 may also be formed without physical separation between sections. Blanking and shaping stations may also be dispersed along the die set 401 (ie. not grouped together in sections as illustrated) to accommodate alternate solar collector configurations or production objectives as desired.

The die set 401 comprises a base block 411 that mounts to a stamping press bolster plate. The base block 411 defines a lower cutting die 412 and a lower shaping die 413. The lower cutting die 412 and the lower shaping die 413 are associated with the blanking section 420 and shaping section 430 respectively. The lower shaping die 413 has a concave shaping surface that combines with a complimentary upper die 417 to press the collection surface of solar collector blank into a dish shape. The concave shaping surface of the lower shaping die 413 has a form factor of less than 3 ft by 3 ft, corresponding to the collection surface form factor of solar collector produced in the die set 401. The base block 411 is the only component of the illustrated die set 401 that fastens to the stamping press.

An upper block 415 is supported over the base block 411. The upper block 415 defines upper cutting 416 and shaping 417 dies that are reciprocal with the corresponding lower dies 412, 413. The upper shaping die 417 has a convex punching surface that is generally commensurate with the concave surface of the lower shaping die 413. The surface curvature of the complimentary upper 417 and lower 413 shaping dies defines the collection surface curvature of solar dishes produced by the production line 400. The complimentary surfaces of the upper 417 and lower 413 shaping dies approximate a circular paraboloid in the illustrated die set 401. The upper 416 and lower 412 cutting dies have a complimentary arrangement of punches and recesses that combine to remove material from the metallic strip 402 in preparation of a solar collector blank. The upper block 415 abuts with a stamping press ram during production, bringing the respective blocks 411, 415 together and mating the upper 416, 417 and lower 412, 413 dies about the metallic strip 402. The illustrated dies refine the metallic strip 402 into the workpiece illustrated in FIGS. 13 and 14 with each reciprocation of the stamping press ram.

A plurality of posts 410 extend between the respective blocks 411, 415 to position the upper dies 416, 417 relative to the lower dies 412, 413. The upper cutting 416 and shaping 417 dies are supported over the corresponding lower dies 412, 413 in the base block 411. Each post 410 is sleeved into a complimentary recess in one of the blocks 411, 415. The block recess associated with each post 410 is capable of receiving a portion of the post 410 so that the blocks 411, 415 can be pressed together during extension of a stamping press ram. Each recess accommodates enough of the corresponding post 410 to facilitate mating of the respective upper 416, 417 and lower 412, 413 dies about a workpiece.

The upper block 415 is biased away from the lower block 411 so that the respective blocks separate with contraction of the stamping press ram. Each post 410 may incorporate a spring that opposes recession of the post 410 into the respective block, biasing the blocks 411, 415 apart. Preferably each post 410 incorporates a gas spring that can be interconnected with the gas springs of other posts 410 in a manifold to balance the spring pressure and associated biasing force at various locations over the die set 401.

A cutting block 435 is mounted to the stamping press after the shaping section 430. The cutting block 435 has a fixed lower blade 436 that fastened to the stamping press adjacent the base block 411. A moving upper plate 437 is disposed over the lower blade 436. The upper blade 436 is depressed to cut the continuous strip of solar collectors produced in the die set 400 into an array of desired length. The upper blade 437 is only depressed when the strip is to be severed (ie. it is not depressed with each reciprocation of the stamping press unless producing individual solar collectors).

The illustrated production line 400 creates an array of uncoated solar collectors from the continuous metallic strip 402. A strip of six solar collectors 440 is illustrated at the outlet of the production line 400 in FIG. 9. The production line may operate at high efficiency, producing in excess of 30 solar collection dishes per minute using the illustrated progressive die set 402. The solar collectors produced in the illustrated production line 400 are limited to a maximum collection surface form factor of 3 ft by 3 ft to accommodate contemporary manufacturing capabilities. However, the production line 400 may be modified along the same lines as described herein to accommodate advances in manufacturing technology. Operation of the illustrated production line 400 generally involves:

1. Feeding a section of the continuous metallic strip 402 into the progressive die set 401, which is mounted to a reciprocating stamping press (corresponding to step 901 of the flow chart illustrated in FIG. 8).
2. Actuating the stamping press so that the reciprocating ram engages the progressive die set 401, causing the cutting die to punch a solar collector blank from the metallic strip (corresponding to step 902 of the flow chart illustrated in FIG. 8).
3. Feeding a subsequent section of the metallic strip into the cutting die, causing the newly created solar collector blank to advance from the cutting die to the shaping die. The die may be accurately positioned within the die set 401 by sets of pilot holes 320 formed during the blanking operations.
4. Actuating the stamping press again so that the stamping press ram engages the progressive die set 401, causing the shaping die to press the solar collector blank into a dish with a form factor of less than 3 ft by 3 ft and the cutting die to punch a new solar collector blank form the metallic strip (corresponding to step 903 of the flow chart illustrated in FIG. 8).

The metallic strip 402 is preferably stored in a coil and progressively unraveled during the process as each new section is fed into the progressive die set 402. The strip 402 is drawn from the coil and straightened 402 by the rollers 404 of straightener 403 prior to being fed into the progressive die set.

The continuous strip of solar collector dishes produced by the progressive die set 401 may be cut at predetermined intervals to form discrete arrays with a desired number of concentrating dishes. The individual dishes are then coated with a high reflectivity coating to improve the collection characteristics of the dish (corresponding to step 902 of the flow chart illustrated in FIG. 8). A release liner or other suitable protection may be applied to the collection surface of the dishes to reduce the possibility of scratching or other damage that may impair the concentration characteristics of the dish.

The evolution of the metallic strip 402 within the progressive die set 401 is illustrated from right to left in FIGS. 13 and 14. The strip 402 is delineated into four sections 310, 320, 330, 340 that represent its progression through the die set 401. Each section represents the operations performed on the metallic strip 402 at a corresponding station within the die set 401. The strip 402 is advanced incrementally through the die set 402, accumulating the various operations at each station as it progresses. The progression increment of the strip 402 is related to the form factor of the solar collector being produced in the die set 402. The size of each section 310, 320, 330, 340 is equivalent the progression increment of the strip 402. The strip 402 is advanced through the die set 401 after each reciprocation of the stamping press by feeding a subsequent section of the metallic strip 402 into the die set 402.

The first three sections 310, 320, 330 reflect the blanking operations of the die set 401, which transform the metallic strip 402 into a solar collector blank. The last section 340 of the strip 402 represents the shaping operation of the die set 401, which transforms the solar collector blank into a dish. The individual operations reflected in each section are cumulative.

The first blanking operations are reflected in section 310 of the metallic strip 402. These operations are performed at the first station where the strip 402 is fed into the progressive die set 401. A set of pilot holes 311 is punched in the strip 402 directly adjacent the entry to the die set 402. The holes 311 are disposed at the junction between the first section 310 and a subsequent section of the metallic strip 402 (ie. the section of the strip 402 that will be fed into the die set 401 next). The pilot holes 311 facilitate accurate positioning of the metallic strip 402 within the die set 402, permitting the different sections 310, 320, 330, 340 to be aligned with the various stations defined along the dies. Each time the strip 402 is advanced, the pilot holes 311 are engaged by the die set 402 to position each section with respect to the die set 401.

The sides 312 of the strip 402 are also trimmed at the first station. Material is removed from the sides 312 to prepare the solar collector blank for shaping later in production and reduce the weight of the solar collector array. The bending resistance of the strip 402 is reduced by removing superfluous material from around the area designated for the dish collection surface. This material may otherwise obstruct the shaping process and cause the strip to crease or deform non-uniformly.

The next set of blanking operations are reflected in section 320 of the metallic strip 402. These operations are applied at the second station within the die set 402, after the first section 310 has been incrementally advanced. More material is punched from the strip 402 at the second station. The material is removed from a central portion of the strip 321 (with respect to the longitudinal mid line of the die set 402) disposed at the junction of the second section 320 and the first section 310. The punching operation removes material from both sections 310, 320. The material is removed to further reduce the strips 402 resistance to bending and decrease the final weight of the solar collector array.

The final set of blanking operations are reflected in section 330 of the metallic strip 402. The operations are conducted at the third station within the progressive die set 402. More material is punched from the strip 402 at the junction of the third section 330 and the second section 320 to produce a completed solar collector blank. The material is removed from spaced positions 331 either side of the central position 321 where material was previously removed. The punching operation removes material from both sections 320, 330.

The strip 402 is then advanced to the final station where the solar collector blank is shaped into a dish. The shaping operation is reflected in section 340 of the metallic strip 402. The solar collector blank is positioned over a concave surface in the lower die and pressed into a dish of complimentary shape by the convex punching surface of the associated upper shaping die. The shaping operation also forms a rounded lip 341 that extends around the collection surface of the dish. The solar collector blank is restrained over the concave shaping surface by engaging the pilot holes 311 during the pressing operation. The shaped solar dish is still connected to the metallic strip 402 as it is advanced out of the die set 401 after shaping.

The progressive die set 401 performs all the operations represented in FIGS. 13 and 14 with each reciprocation of the stamping press ram. A suitably configured die set 401 is capable of replicating these operations in excess of 30 times per minute. The illustrated die set 401 produces a symmetric solar collector array by implementing symmetrical blanking and shaping operations, although this is not essential. The illustrated metallic strip 402 is symmetric about the longitudinal mid line throughout the evolution illustrated in FIGS. 13 and 14. Each solar collector is also symmetric about a transverse mid line dissecting the collection surface.

While the foregoing is directed to embodiments of the present invention, other and further embodiments of the invention may be devised without departing from the basic scope thereof, and the scope thereof is determined by the claims that follow.

The invention claimed is:

1. A solar collector array comprising a plurality of thin walled parabolic dishes interconnected by unitary and integral webbing, the parabolic dishes and the webbing being formed from a single metallic sheet, each parabolic dish having a parabolic surface that concentrates incident light to a position in front of the parabolic dish, each parabolic dish being a circular paraboloid, the surface of each parabolic dish being uninterrupted and corresponding to a parabola revolving around its axis.

2. The solar collector array of claim 1 wherein the dishes are spaced at regular intervals along the array without overlapping.

3. The solar collector array of claim 2 wherein adjacent dishes are separated by a gap of at least 1 inch to allow wind to pass between the dishes.

4. The solar collector array of claim 1 wherein the surface of each dish approximates a continuous uninterrupted paraboloid.

5. The solar collector of claim 1 wherein the parabolic surface of each dish has a diameter of less than 3 ft.

6. The solar collector of claim 1 wherein the array is fabricated from a thin strip of aluminum to reduce the weight of the array.

* * * * *